United States Patent [19]

Brand et al.

[11] 3,787,251

[45] Jan. 22, 1974

[54] MOS SEMICONDUCTOR STRUCTURE WITH INCREASED FIELD THRESHOLD AND METHOD FOR MAKING THE SAME

[75] Inventors: Warren L. Brand, Saratoga; Farajollah Kashkooli, San Jose, both of Calif.

[73] Assignee: Signetics Corporation, Sunnyvale, Calif.

[22] Filed: Apr. 24, 1972

[21] Appl. No.: 246,918

[52] U.S. Cl. .................. 148/187, 148/188, 117/200, 317/235 B

[51] Int. Cl. .................. H01l 7/44

[58] Field of Search .... 148/187, 188; 117/200, 118, 117/229, 215, 47 R; 317/235 B

[56] References Cited

UNITED STATES PATENTS

| | | | |
|---|---|---|---|
| 3,447,238 | 6/1969 | Heynes et al. | 29/590 |
| 3,345,275 | 10/1967 | Schmidt et al. | 204/15 |
| 3,402,081 | 9/1968 | Lehman | 148/188 |
| 3,386,163 | 6/1968 | Brennemann et al. | 29/571 |
| 3,547,717 | 12/1970 | Lindmayer | 148/187 |
| 3,560,280 | 2/1971 | Nishida | 156/17 |

*Primary Examiner*—Hyland Bizot
*Assistant Examiner*—J. M. Davis
*Attorney, Agent, or Firm*—Paul D. Flehr et al.

[57] ABSTRACT

An MOS semiconductor structure and method for making the same in which a semiconductor wafer is treated to form an thin oxide layer having a net charge. In a specific embodiment a positive net charge is introduced into the oxide layer through introduction of chrome ions. Field oxide is then grown over the thin oxide layer. The field oxide and thin oxide layers are removed from selective portions of the semiconductor wafer. Source and drain diffusions are made into the semiconductor wafer and a gate oxide along with gate source and drain electrodes are formed. The introduction of the positive oxide charge over the field region increases the field voltage threshold and permits use of a thinner field oxide.

4 Claims, 5 Drawing Figures

MOS SEMICONDUCTOR STRUCTURE WITH INCREASED FIELD THRESHOLD AND METHOD FOR MAKING THE SAME

BACKGROUND OF THE INVENTION

This invention relates to integrated circuits and more specifically relates to an integrated circuit which includes an MOS semiconductor structure with an increased field voltage threshold and a method for making the same.

Integrated circuit technology for forming integrated circuits including a plurality of MOS devices imposes some restrictions on the portions of semiconductor wafers between the MOS devices. The area of a semiconductor wafer outside of the source and drain regions and the channel of a MOS device is referred to as the field region. Generally a relatively thick layer of oxide, which is known as field oxide, is deposited on top of the surface of the field regions of the integrated circuit. Metallization is then formed on top of the field oxide with such metal conductor lines running back and forth to connect various of the devices together and to make external connection to the integrated circuit.

Taking as an example P-channel type MOS devices, such devices comprise P-type source and drain regions separated by an N-type channel. A negative voltage is supplied to a gate electrode on top of the gate oxide overlying the channel and functions to invert the N-type semiconductor region immediately under the gate and connecting the P-type source and drain regions. This inversion occurs at a particular value of negative voltage applied to the gate electrode which is called the threshold voltage.

In integrated circuits involving a plurality of such P-channel MOS devices, problems sometimes exist with undesired inversion of N-type semiconductor material at field regions thereof; that is, at locations between devices for example. This occurs because of the voltages present on conductor lines which run over the field oxide. This undesired inversion really creates parasitic devices since it can link a P-region in one MOS device to a P-region in another MOS device.

In the prior art two techniques are commonly used to prevent such undesired inversion. One of these is to form a very thick field oxide layer on MOS integrated circuits. Providing such a thick field oxide brings with it problems of its own, such as the fact that when the field oxide is etched to form the MOS devices, there results very steep and long slopes of oxide leading down to the devices and problems occur in depositing metallization for connecting the MOS devices. Another prior art technique comprises doping the outside portion of the field with a higher concentration of impurity. Thus for P-channel type MOS devices the N-type semiconductor material would be doped with a higher concentration of N-type impurity. Such doping requires an extra masking step however. That is, the portion of the N-type semiconductor material forming a channel between source and drain regions of P-type cannot be doped with a higher concentration of N-type impurity because this would lead to a very high threshold voltage for the MOS device. Therefore, an extra masking step is required so as to increase the N-type impurity concentration only in the field areas. Where such N+ field opening is used, besides the extra masking step required, there are also very real problems of lateral P-N-P transistor effects caused by the N+ field doping.

Therefore, what is needed is an MOS integrated circuit having a high field voltage threshold without requiring a very thick field oxide and without requiring N+ field doping.

OBJECTS AND SUMMARY OF THE INVENTION

It is accordingly an object of this invention to provide an MOS integrated circuit and method for making the same which exhibits a very high field threshold voltage for preventing parasitic linking of MOS devices.

It is a more specific object of this invention to provide such an MOS integrated circuit structure and method without requiring thick field oxide or additional field doping.

Briefly, in accordance with one embodiment of the invention, the top surface of a semiconductor wafer is treated with an oxidizing solution having ions in solution so that a thin layer of xoide is formed thereon with ions trapped in the thin oxide layer. Next, the field oxide is deposited or thermally grown over the thin layer of oxide and portions of both the field oxide and the thin layer of oxide are removed from selected portions of the semiconductor wafer. Source and drain regions are formed in the selected portions where the oxide layers have been removed. Gate oxide as well as gate electrodes and source and drain electrodes are then formed. The net charge due to the ions associated with the thin oxide layer overlying the field region between MOS devices raises the threshold voltage of such field regions.

BRIEF DESCRIPTION OF THE DRAWINGS

In particular, FIG. 1 is a cross-sectional diagram of a semiconductor wafer having been treated to form a thin oxide layer having a net charge thereon.

FIG. 2 shows the structure of FIG. 1 after the field oxide has been deposited or thermally grown.

FIG. 3 shows the structure of FIG. 2 after selected portions of the oxide layers have been removed.

FIG. 4 shows the structure of FIG. 3 after source and drain diffusions have been made.

FIG. 5 shows the structure of FIG. 4 after a gate oxide has been formed and gate and source and drain electrodes have been formed.

DESCRIPTION OF THE PREFERRED EMBODIMENTS

Figure 1:
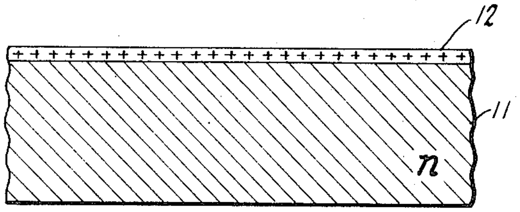
FIGS. 1 through 5 show various steps in the method of constructing an integrated circuit having MOS devices with increased field voltage thresholds.

The method of this invention involves treating a semiconductor surface with an oxidizing solution having ions in solution so that a thin oxide layer is formed on the semiconductor surface which has ions therein so that the oxide has a net electrical charge. As a specific example and in accordance with one embodiment of the invention, a starting wafer of silicon which is doped for example to have an N-type impurity throughout is immersed in an oxidizing solution including positive ions in solution. One particular solution for treating wafers in a manner according to this invention may consist of 12 grams of $CrO_3$, 100 milliliters of deionized $H_2O$, and 1,000 milliliters of concentrated $H_2SO_4$. These concentrations are not critical. The solution is preferably maintained at an elevated temperature, something on the order of 160° C for example, and the wafer may be left in the solution for a time period of, say 15 minutes. The wafers are then removed from the solution, rinsed and dried. As an example, the rinsing can be with deionised water and the wafer may be blown dry in nitrogen. A structure such as shown in cross-section in FIG. 1 results wherein the N-type semiconductor wafer 11 has a thin layer of oxide 12 thereon with this thin layer of oxide including positively charged chrome ions so that the thin layer of oxide 12 has a net positive charge due to the presence of these chrome ions. This thin layer of chrome ion containing oxide 12 is on the order of 50 to 60 angstrom units thick.

Figure 2:
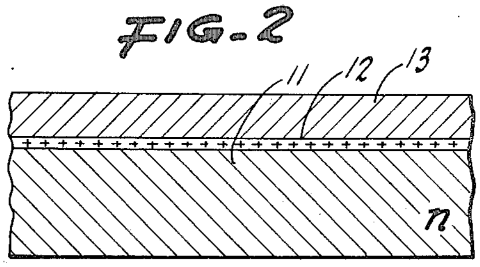
Figure 3:
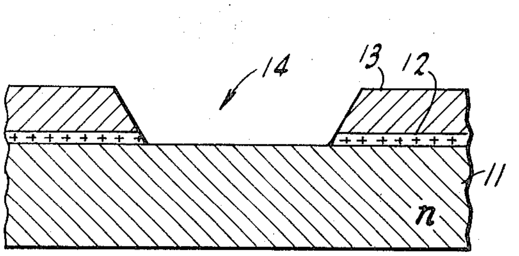
Figure 4:
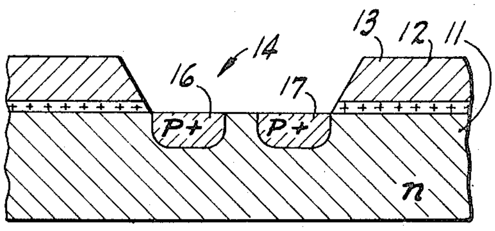

After treating the semiconductor wafer 11 in the manner described above, fabrication proceeds for forming MOS devices in the wafer. Thus the next step as shown in FIG. 2 is the growth of a relatively thick oxide layer 13, which is referred to as the field oxide, on top of the thin layer of oxide 12 which is in turn on top of the semiconductor wafer 11. Then through suitable photolithographic masking techniques as are well known in the art, a portion of the oxide layers are removed. FIG. 3 shows a construction in which the field oxide layer 13 and the thin layer 12 have been removed from a selective portion of the semiconductor wafer 11 to form a window 14 therein. It should be noted at this juncture that conventional etching techniques are effective to remove both field oxide layer 13 and the thin oxide layer 12 with the chrome ions therein. Next, P+ type diffusions are made into the semiconductor wafer 11 to form, for example, the source and drain regions 16 and 17.

Figure 5:
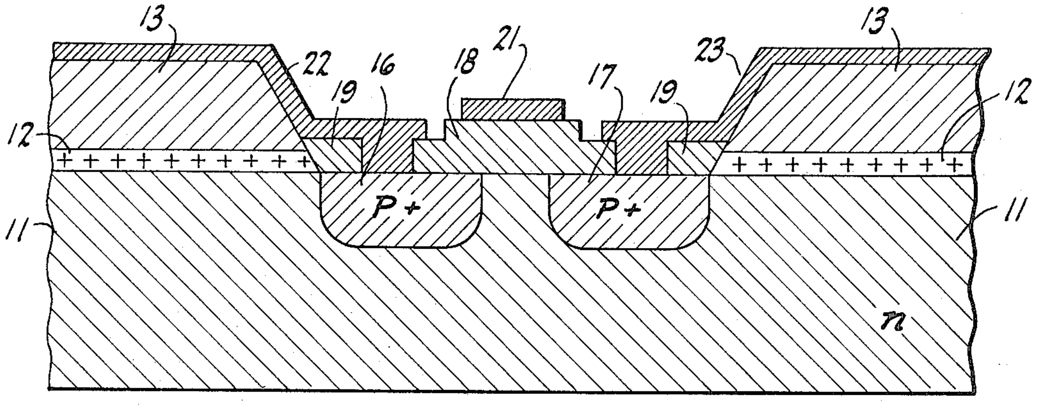

After the source and drain regions 16 and 17 have been formed, a gate oxide 18 is deposited or thermally grown on the surface of the semiconductor wafer 11 along with surface passivating oxide 19 over the source and drain regions 16 and 17. Then a gate electrode 21 is formed on top of the gate oxide 18 and source and drain electrodes 22 and 23 are formed which extend down and make contact with the P-type source and drain regions 16 and 17 respectively. Thus what results is an integrated circuit having MOS devices with a structure such as shown in FIG. 5. In the structure of FIG. 5 the field regions of the semiconductor wafer 11; that is, the portions of the semiconductor wafer outside of and between various MOS devices, has not only the field oxide layer 13 thereon but also has a thin layer of oxide 12 which contains the positive chrome ions. The net positive charge resulting from the presence of the chrome ions increases the threshold voltage of the N-type semiconductor material in the wafer 11 in these field areas.

It has been found that these chrome ions remain in the oxide layer 12 and do not interfere with the opening of windows such as window 14 for forming MOS devices. Thus when windows are opened by etching through the field oxide 13 and oxide layer 12 the oxide layer 12 along with the chrome ions retained therein is removed from that selective portion of the semiconductor wafer. The positive charges associated with removed layer 12 are completely gone and do not enter into or affect the portion of the semiconductor wafer 11 where the MOS devices are formed. Further, the positive chrome ions overlying the field regions of MOS integrated circuits have been found to be very stable both with temperature variations and time. That is, they do not migrate or disburse but remain adjacent to the surface of the semiconductor wafer 11 and the field regions thereof for contributing a net positive charge which is effective to increase the voltage inversion threshold for these field regions of the MOS semiconductor wafer 11.

Whie a specific embodiment of the invention has been disclosed, it will be obvious to those skilled in the art that minor modifications and variations may be made therein without departing from the true spirit and scope of the invention.

We claim:

1. A method of making an integrated circuit including an MOS semiconductor device for a semiconductor wafer having a top and bottom surface comprising the steps of treating the top surface with an oxidizing solution having ions in solution whereby a thin layer of oxide is formed thereon with ions trapped in the thin oxide layer so that the thin oxide layer has a net charge, forming a layer of field oxide over the thin layer of oxide, removing portions of both the layer of field oxide and thin layer of oxide from a selected portion of the semiconductor wafer top surface, forming source and drain regions in the semiconductor wafer adjacent the selective portion of the top surface, forming a gate oxide on a part of the selective portion of the wafer top surface, forming a gate electrode on the top of the gate oxide and forming source and drain electrodes for contacting the source and drain regions.

2. A method in accordance with claim 1 wherein the wafer top surface is treated with an oxidizing solution having positive ions in solution to form a thin oxide layer having a net positive charge, and wherein the semiconductor wafer is of N conductivity type and the source and drain regions are formed to have P-type conductivity so that P channel MOS devices are formed.

3. A method in accordance with claim 2 wherein the positive ions in solution are chrome ions.

4. A method in accordance with claim 2 wherein the oxidizing solution comprises chromic oxide and an acid which yields positive chrome ions in solution.

* * * * *